United States Patent
Yim et al.

(10) Patent No.: US 7,474,158 B1
(45) Date of Patent: Jan. 6, 2009

(54) DYNAMIC MATCH LOW NOISE AMPLIFIER WITH REDUCED CURRENT CONSUMPTION IN LOW GAIN MODE

(75) Inventors: Seong-Mo Yim, Summerfield, NC (US); Kelvin Kai Tuan Yan, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 12 days.

(21) Appl. No.: 11/692,575

(22) Filed: Mar. 28, 2007

Related U.S. Application Data

(60) Provisional application No. 60/790,720, filed on Apr. 10, 2006.

(51) Int. Cl.
*H03F 3/04* (2006.01)
(52) U.S. Cl. ...................... 330/311; 330/310
(58) Field of Classification Search .................. 330/285, 330/296, 310, 311
See application file for complete search history.

(56) References Cited

U.S. PATENT DOCUMENTS

| | | | |
|---|---|---|---|
| 6,636,119 B2* | 10/2003 | Vathulya | 330/311 |
| 7,023,272 B2* | 4/2006 | Hung et al. | 330/126 |
| 7,126,428 B2* | 10/2006 | Lin et al. | 330/311 |
| 7,352,247 B2* | 4/2008 | Oh et al. | 330/311 |

OTHER PUBLICATIONS

Aparin, Vladimir et al., "Modified Derivative Superposition Method for Linearizing FET Low Noise Amplifiers," Proceedings of the 2004 IEEE Radio Frequency Integrated Circuits Symposium, 2004, pp. 105-108, IEEE.

Gatta, Francesco et al., "A Fully Integrated 0.18-mm CMOS Direct Conversion Reciever Front-End With On-Chip LO for UMTS," IEEE Journal of Solid-State Circuits, Jan. 2004, pp. 15-23, vol. 39, No. 1, IEEE.

* cited by examiner

*Primary Examiner*—Henry K Choe
(74) *Attorney, Agent, or Firm*—Withrow & Terranova, P.L.L.C.

(57) ABSTRACT

The present invention is a dual mode LNA that can operate in either normal mode or low-gain mode, which has been designed to maintain a constant input impedance when switching between the two modes of operation. Maintaining constant input impedance is called a dynamic match. The LNA has been designed to maintain a constant bandwidth when switching between normal and low-gain modes of operation. Also, the LNA has been designed to consume much less average current when operating in the low-gain mode.

15 Claims, 6 Drawing Sheets

DYNAMIC MATCH LOW NOISE AMPLIFIER WITH REDUCED CURRENT CONSUMPTION IN LOW GAIN MODE

This application claims the benefit of U.S. provisional patent application Ser. No. 60/790,720, filed Apr. 10, 2006, which is incorporated herein by reference in its entirety.

FIELD OF THE INVENTION

The present invention relates to Low Noise Amplifiers (LNAs) and mixers used in Radio Frequency (RF) communications circuitry, which is used in communications systems.

BACKGROUND OF THE INVENTION

LNAs are commonly used in RF circuits when small RF signals need to be amplified for further processing. A typical application is in the front end of an RF receiver. An LNA may be the first active component in the receiver's signal path. In many applications, RF receivers must be able to function over a wide dynamic range of received signals; therefore, an LNA in the front end of such an RF receiver must be able to function over a wide dynamic range. An operating range between −100 dbm to −25 dbm is not unusual.

One design challenge occurs when an LNA is designed with sufficient RF gain to amplify the smallest signals, such as signals at −100 dbm. When the LNA then receives a large signal, such as signals at −25 dbm, the LNA or some of the downstream circuitry can become overloaded, driven into compression or saturation. One way to resolve this issue is to design an LNA with two modes of operation: a normal mode and a low-gain mode. In normal mode, the LNA operates with its maximum RF gain, which is sufficient to amplify the smallest signals. In low-gain mode, the LNA operates with reduced RF gain such that the circuitry is not overloaded. The low-gain mode is automatically selected when the LNA is receiving relatively large RF signals, such as those greater than −60 dbm.

A conventional single-ended cascode LNA 10 is shown in FIG. 1. In this example, N-Channel Metal Oxide Semiconductor Field Effect Transistors (N-MOSFETs) are used; however, other technologies, such as Junction Field Effect Transistors (JFETs) or bi-polar transistors, have also been used in LNA designs. The LNA 10 is constructed of a cascode transistor 12, which is used to increase both the output-to-input isolation and the output impedance; a gain transistor 14, which amplifies the RF input signal and sets the DC current level of the LNA 10; a load inductor 16; and a source inductor 18, which helps determine the input impedance of the LNA 10. The input impedance of the LNA 10 is determined by a combination of the gate-to-source capacitance 20 of the gain transistor 14, the source inductor 18, and the gain characteristics of the gain transistor 14. During normal operation, the DC current level of the LNA 10 is set by applying a DC voltage, called Vbias1, to the gate of the gain transistor 14 through a first bias resistor R1, and a DC voltage, called Vbias2, to the gate of the cascode transistor 12. The RF input signal to the LNA 10 is applied to the gate of the gain transistor 14. The RF output from the LNA 10 is taken from the drain of the cascode transistor 12. Normally, the gain transistor 14 functions in its saturated operating region.

A conventional differential cascode LNA 22 is shown in FIG. 2. A differential LNA 22 amplifies the difference between two input signals to create two amplified differential output signals. This LNA design essentially functions as two symmetrical, single-ended designs combined to form one differential design. One of the single-ended designs is arbitrarily designated as the positive side of the LNA 22, and the other single-ended design is arbitrarily designated as the negative side of the LNA 22. In this example, N-MOSFETs are used. The LNA 22 is constructed of a positive side cascode transistor 24 and a negative side cascode transistor 26, both of which are used to increase the isolation of their respective sides of the LNA 22; a positive side gain transistor 28 and a negative side gain transistor 30, both of which amplify the RF input signal of their respective sides; a center-tapped load inductor 32; and a center-tapped source inductor 34, which helps determine the input impedance of the LNA 22. During normal operation, the DC current level of the LNA 22 is set by applying a DC voltage, called Vbias2, to the gates of the cascode transistors 24, 26, and a DC voltage, called Vbias1, to the gates of the gain transistors 28, 30 through a second bias resistor R2 and a third bias resistor R3. The differential RF input signal to the LNA 22 is applied between the gates of the positive side gain transistor 28, and the negative side gain transistor 30. The RF output from the LNA 22 is taken from the drains of the positive side cascode transistor 24 and the negative side cascode transistor 26. Normally, the positive side gain transistor 28, and the negative side gain transistor 30 function in their saturated operating regions.

Several characteristics are desirable in a dual mode LNA. Since the matching circuitry connected to the input of an LNA is often a fixed impedance, it is desirable for the input impedance of the dual mode LNA to remain constant when switching between the two modes of operation. It is desirable for both modes of an LNA to function over the same operating frequency, which is a function of the LNA's bandwidth. Also, it is desirable for the average current consumption of an LNA to be as small as possible.

There are several conventional methods for implementing a low-gain mode; however, each of them has shortcomings. One method is to reduce the DC operating current level of the LNA by reducing Vbias1. This method has the benefit of reducing LNA gain and current consumption in low-gain mode; however, the LNA's cut-off frequency and the real part of the LNA's input impedance are also reduced, therefore, the input impedance is different for each mode of operation. A second method is to use some type of low-gain circuit such as a MOS bypass switch between input and output. This method does have the advantage of reduced average current consumption in bypass mode; however, such circuits have gain loss through the switch when they are in bypass mode, and when the mode is switched, the input impedance is changed and the phase of the RF signal is changed abruptly. A third method is to use a steering current circuit to divert current from the gain transistor(s). This method does allow for precise control of LNA gain in low-gain mode and has constant input impedance at normal and low-gain modes; however, average current consumption remains unchanged in low-gain mode.

SUMMARY OF THE INVENTION

The present invention is a dual mode LNA that can operate in either normal mode or low-gain mode, which has been designed to maintain the input impedance close to a matching point when switching between the two modes of operation. Maintaining input impedance close to a matching point is called a dynamic match. Also, the LNA has been designed to consume less average current and lower gain when operating in the low-gain mode.

In one embodiment, the present invention is implemented using two parallel cascode transistor circuits and one center-tapped source inductor to create a single-ended LNA. During the normal mode of operation, both cascode circuits are active to provide sufficient gain to amplify small RF signals. During the low-gain mode of operation, one of the cascode circuits is powered down. This reduces the gain of the LNA, and reduces the average current consumption of the LNA. The LNA input impedance remains close to the matching point between normal mode and low-gain mode by the addition of an inductor between the common source or emitter elements of the two cascode circuits. The addition of the inductor compensates for the impedance change by the gate capacitance of the off-transistor at the input node. The phase of the RF output signal changes little by switching between normal and low-gain modes.

In another embodiment, the present invention is implemented using a positive side of two parallel cascode circuits and a negative side of two parallel cascode circuits to create a differential LNA.

The present invention can be implemented using any transistor technology such MOSFET technology, JFET technology, or bipolar technology. The matching point may be substantially 50 ohms.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE INVENTION

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
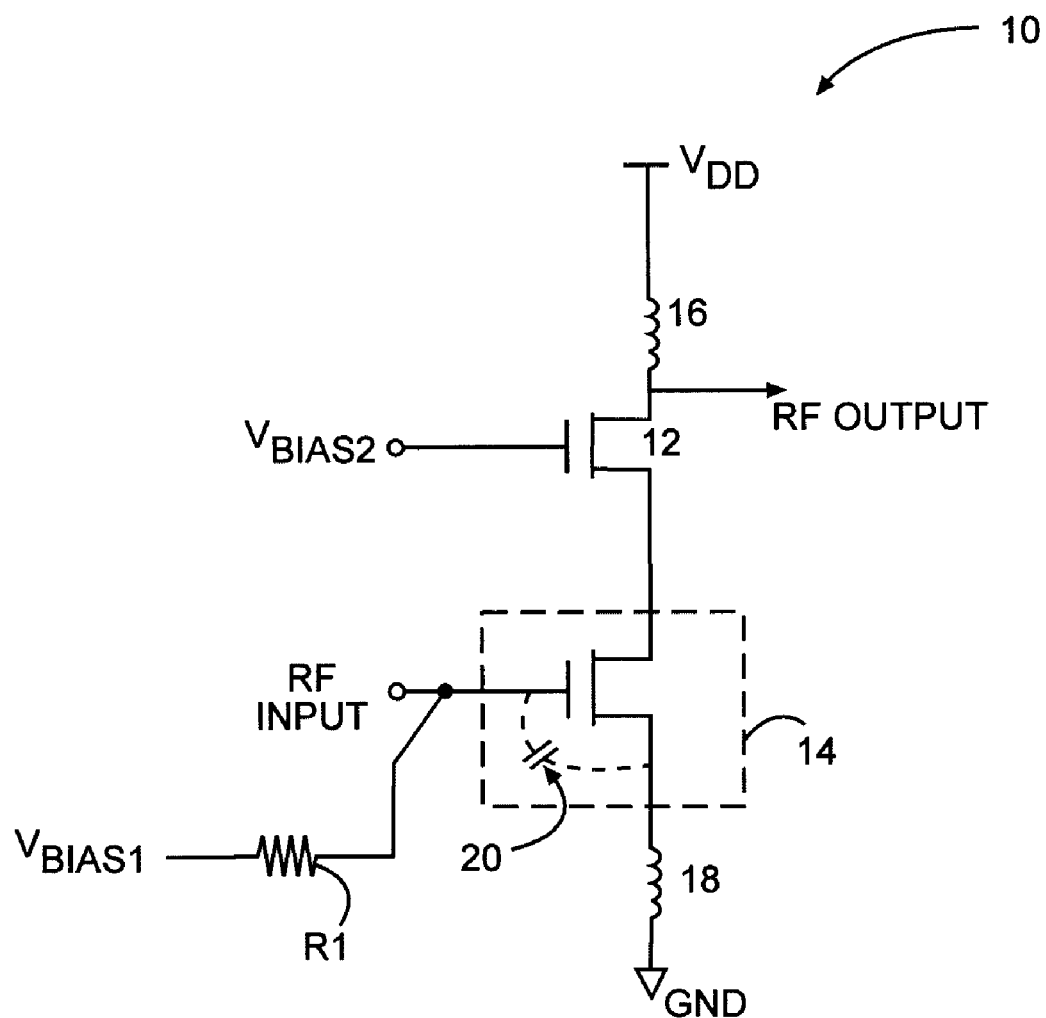
FIG. 1 shows a conventional single-ended cascode LNA, which is one example of prior art.
Figure 2:
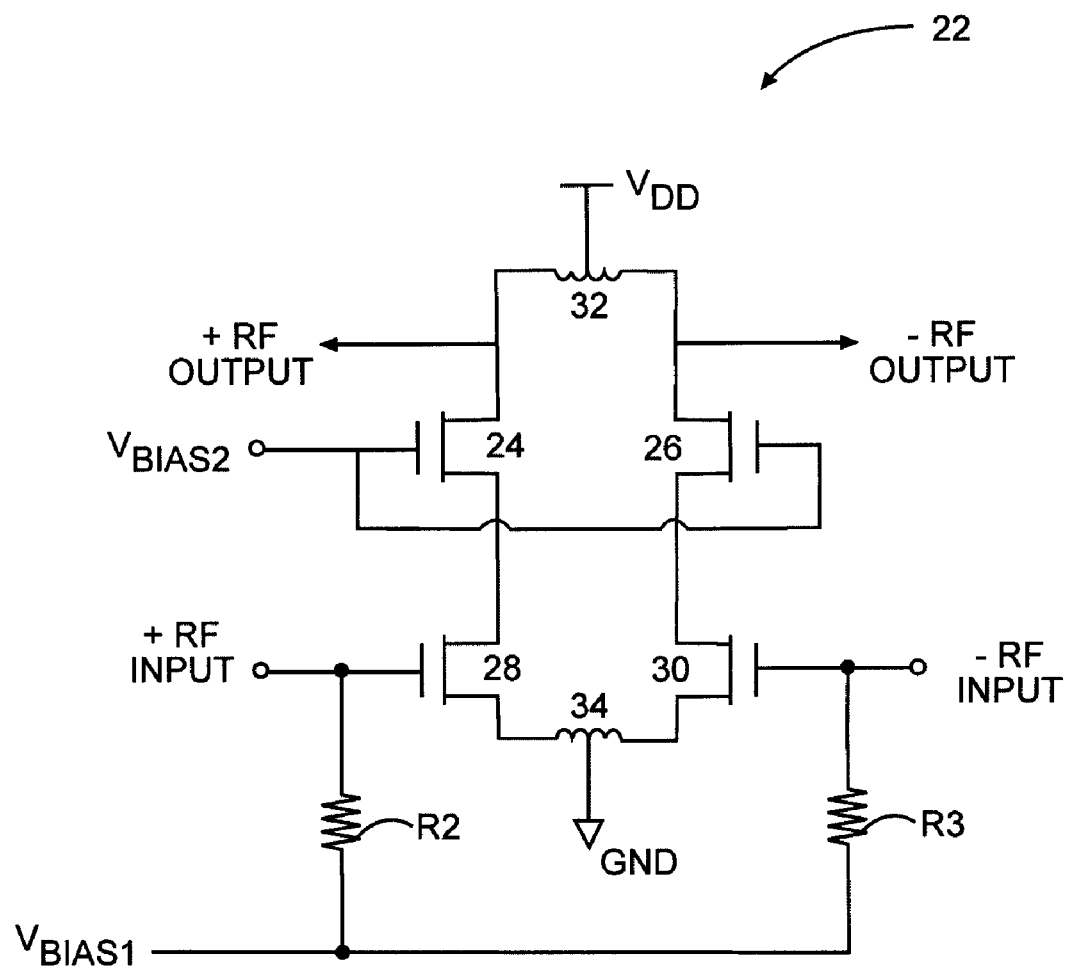
FIG. 2 shows a conventional differential cascode LNA, which is another example of prior art.
Figure 3:
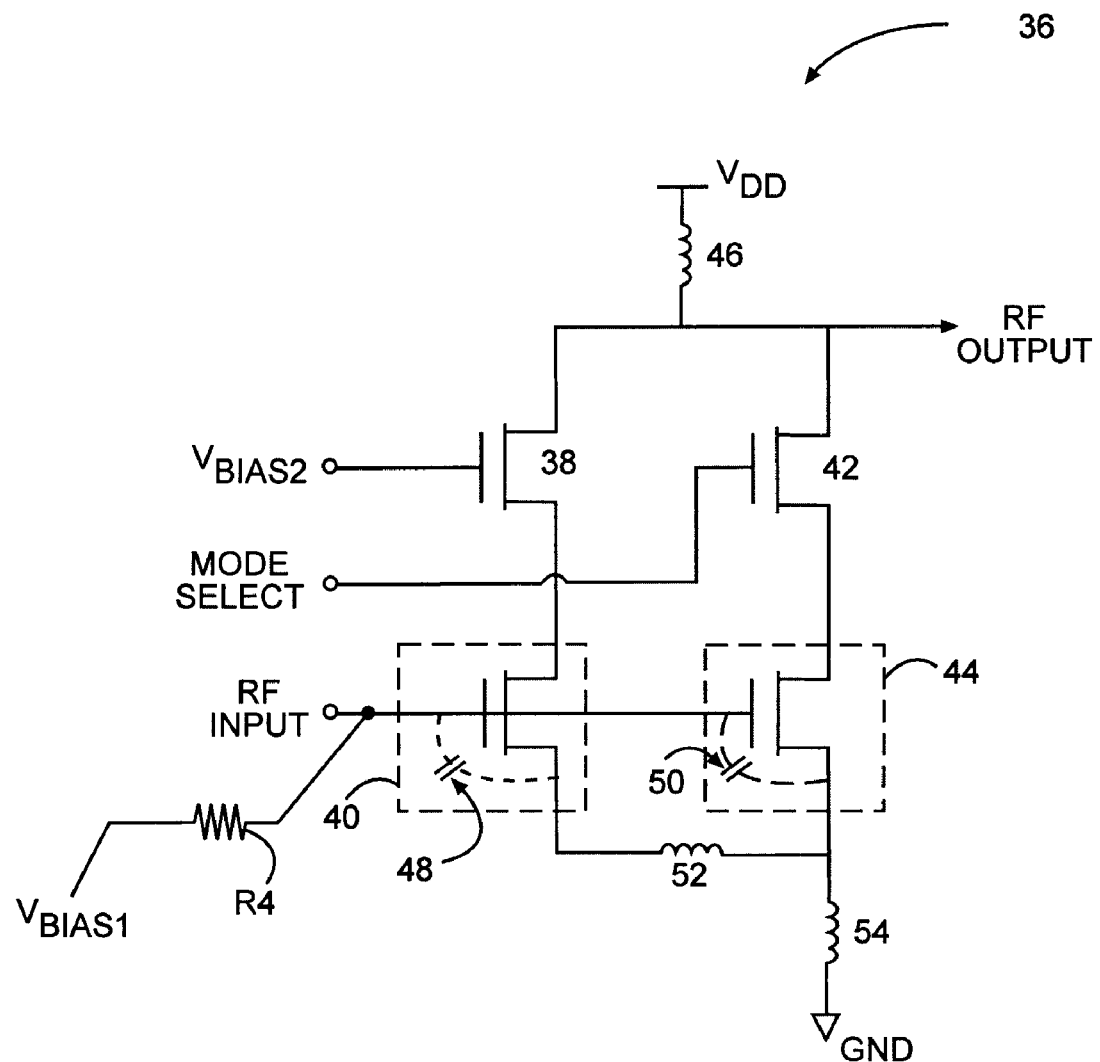
FIG. 3 shows one embodiment of the present invention implemented in a dual mode single-ended cascode LNA using N-MOSFETs as the active elements.

One embodiment of the present invention is a dual mode single-ended cascode LNA 36 using N-MOSFETs as the active elements as shown in FIG. 3. A main cascode transistor 38 and main gain transistor 40 form the main cascode circuit, while a normal mode cascode transistor 42 and normal mode gain transistor 44 form the normal mode cascode circuit with high gain. A common load inductor 46 is connected to both cascode circuits.

The DC current levels of the main cascode and normal mode circuits are set by applying a DC voltage, called Vbias1, to the main gain transistor 38 and the normal mode gain transistor 44 through a fourth bias resistor R4. The main cascode circuit is functional in both normal and low-gain modes of operation. The normal mode cascode circuit is functional only during the normal mode of operation and not during low-gain mode. The DC current level of the normal mode cascode circuit is set by applying a DC voltage to the normal mode gain transistor 44. The DC voltage applied to the gate of the normal mode cascode transistor 42 is called mode select. During low-gain mode of operation, mode select is zero volts, which turns off the normal mode cascode transistor 42 and the normal mode gain transistor 44. This effectively powers down the normal mode cascode circuit. During normal mode of operation, mode select is similar in value to Vbias2.

During normal mode of operation, both the main gain transistor 40 and the normal mode gain transistor 44 work together to form an amplifying element to amplify the RF input signal. During low-gain mode of operation, only the main gain transistor 40 works as the amplifying element to amplify the RF input signal. The gain of an N-MOSFET decreases as the width of the N-MOSFET decreases. This causes a gain reduction during low-gain mode due to the reduction of the effective width of the amplifying element since only one gain transistor is operational.

During normal mode of operation, the input impedance of the LNA 36 is determined by a combination of a gate to source capacitance 48 of the main gain transistor 40, a gate to source capacitance 50 of the normal mode gain transistor 44, a low-gain mode compensation inductor 52, a source inductor 54, gain characteristics of the main gain transistor 40, and gain characteristics of the normal mode gain transistor 44. During low-gain mode of operation, the input impedance of the LNA 36 is determined by the above factors minus the gain characteristics of the normal mode gain transistor 44. The values of the low-gain mode compensation inductor 52 and the source inductor 54 are chosen to yield the desired LNA input impedance during normal mode of operation. The ratio of the value of the low-gain mode compensation inductor 52 to the value of the source inductor 54 are chosen such that the LNA input impedance during normal mode of operation is identical to the LNA input impedance during low-gain mode of operation, which provides the dynamic match aspect of the present invention. The low-gain mode compensation inductor 52 is compensating for the gate to source capacitance 50 of the normal mode gain transistor 44 during low-gain mode.

Both cascode circuits are designed with the same cut-off frequency; therefore, the transistor current gain will be identical for either mode of operation. Since the normal mode cascode circuit is effectively powered down during low-gain mode of operation, the average current consumption of the LNA can be significantly reduced. A reduction of up to 80% is possible.

Figure 4:
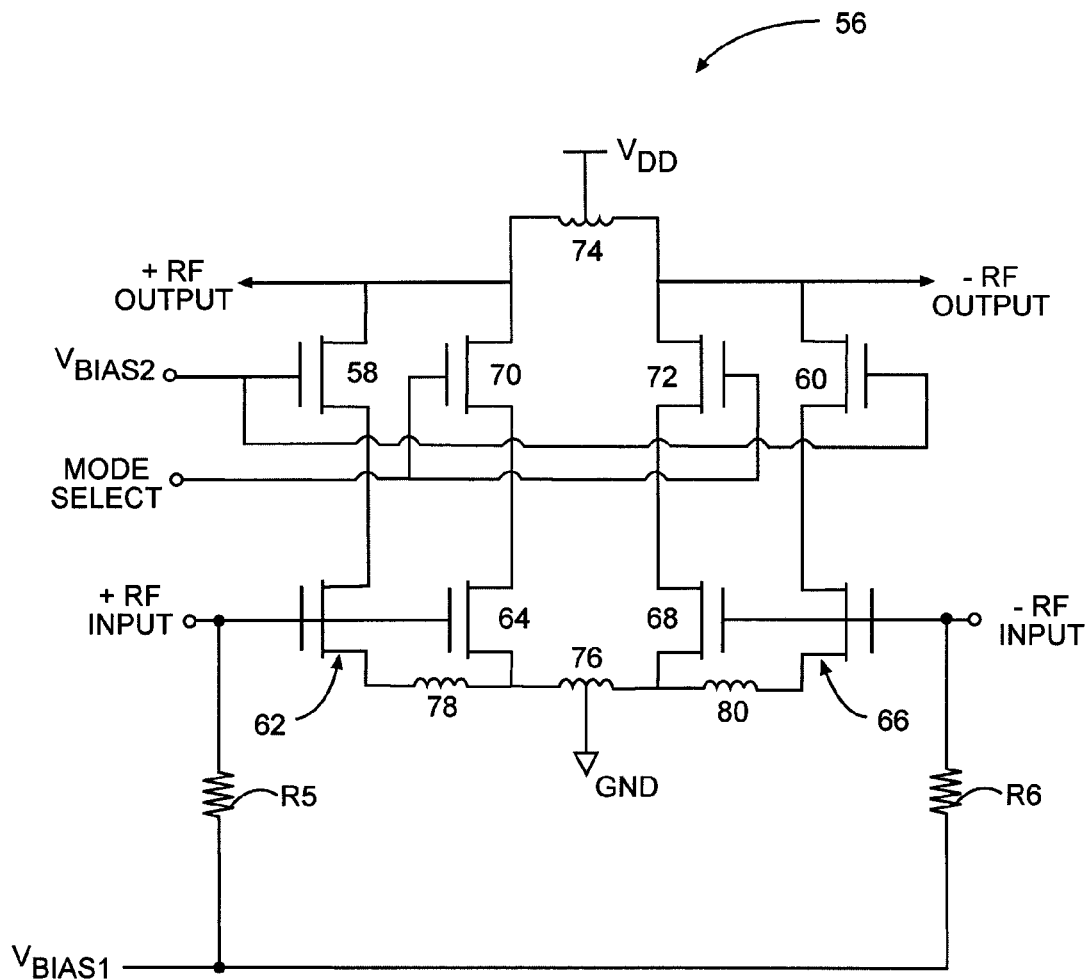
FIG. 4 shows another embodiment of the present invention implemented in a dual mode differential cascode LNA using N-MOSFETs as the active elements.

Another embodiment of the present invention is a dual mode differential cascode LNA 56 employing N-MOSFETs as the active elements as shown in FIG. 4. The dual mode differential LNA 56 amplifies the difference between two input signals to create two amplified differential output signals. This LNA 56 design essentially functions as two symmetrical dual mode single-ended designs combined to form one differential design. One of the single-ended designs is arbitrarily designated as the positive side of the LNA 56, and the other single-ended design is arbitrarily designated as the negative side of the LNA 56. Each side of the LNA 56 is comprised of a main cascode circuit and a normal mode cascode circuit, similar to the cascode circuits in the previous embodiment. The LNA 56 is constructed of a positive side main cascode transistor 58 and a negative side main cascode transistor 60, both of which are used to set the DC current level in the main cascode circuits on their respective sides of the LNA 56. The LNA 56 also employs a positive side main gain transistor 62, a positive side normal mode gain transistor 64, a negative side main gain transistor 66, and a negative side normal mode gain transistor 68, all four of which amplify the RF input signal on their respective sides during normal mode operation. The LNA 56 also employs a positive side normal mode cascode transistor 70 and a negative side normal mode cascode transistor 72, both of which are used to set the DC current level in the normal mode cascode circuits on their respective sides of the LNA 56. The LNA 56 employs a center-tapped load inductor 74, a center-tapped source inductor 76, a positive side low-gain mode compensation inductor 78, and a negative side low-gain mode compensation inductor 80, all four of which are used to help determine the input impedance of the LNA 56.

During normal mode of operation, the DC current level of the cascode circuits in the LNA 56 are set by applying a DC voltage, called Vbias1, to the gates of the gain transistors 62, 64, 66, 68 through a fifth bias resistor R5 and a sixth bias resistor R6. The DC current level of the normal mode cascode circuits in the LNA 56 are set by applying a DC voltage, called mode select, which is similar in value to Vbias2 to the gates of the normal mode cascode transistors 70, 72. During low-gain mode of operation, mode select is zero volts, which turns off both normal mode cascode transistors 70, 72. This effectively powers down the normal mode cascode circuits.

The differential RF input signal to the LNA 56 is applied between the gates of the positive side gain transistors 62, 64, and the gates of the negative side gain transistors 66, 68. The RF output from the LNA 56 is taken from the drains of the positive side cascode transistors 58, 70 and the negative side cascode transistors 60, 72. Normally, the gain transistors 62, 64, 66, 68 function in their saturated operating regions.

The center-tapped load inductor 74 could be replaced in the design with two separate inductors. The center-tapped source inductor 76 could also be replaced in the design with two separate inductors. The center-tapped source inductor 76, the positive side low-gain mode compensation inductor 78, and the negative side low-gain mode compensation inductor 80 could be replaced in the design with a single 5-lead inductor with the appropriate taps.

Figure 5:
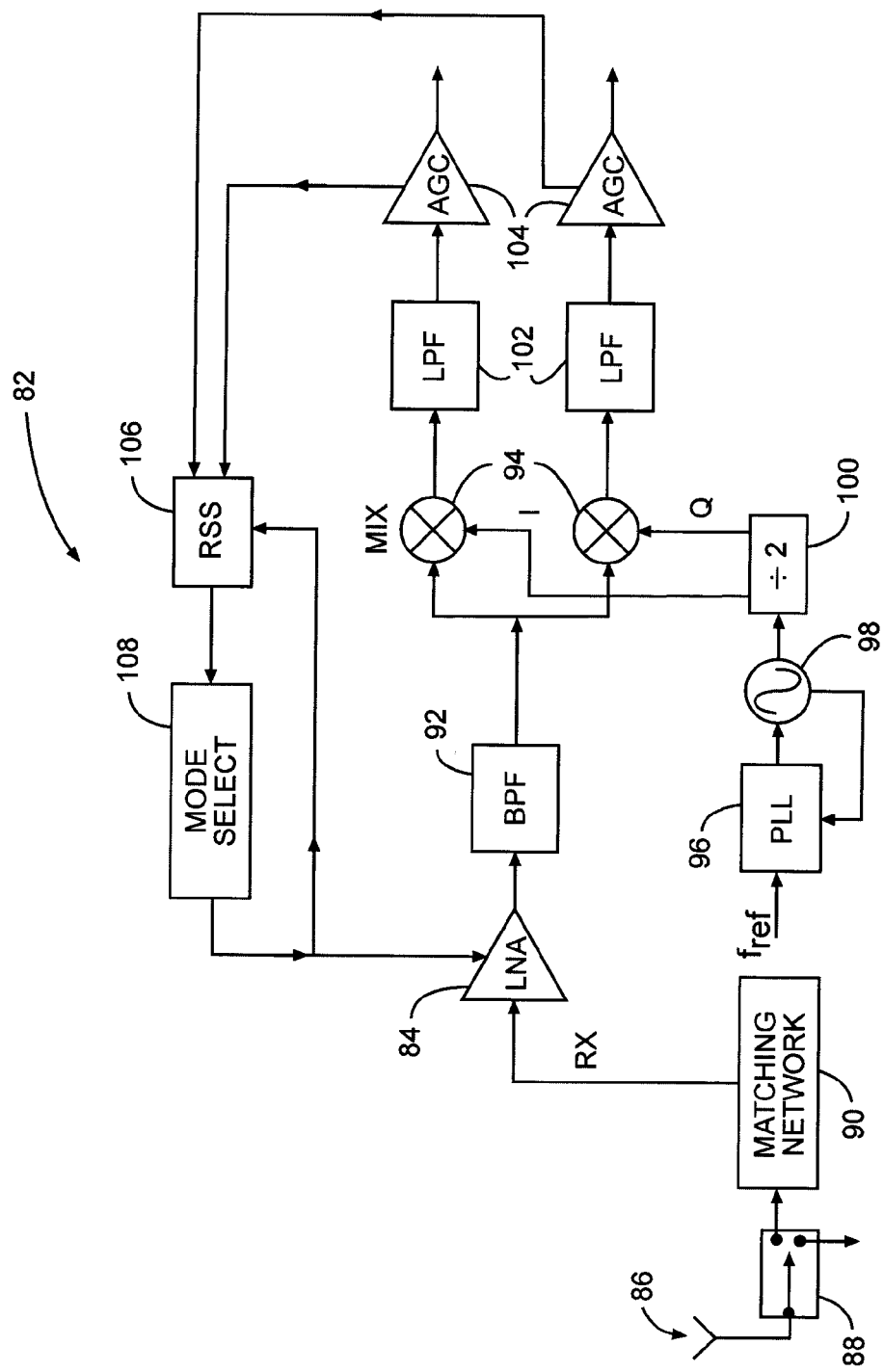
FIG. 5 shows one application of the present invention used in the front-end of an RF receiver.

LNAs are commonly used in the front ends of RF receivers. One example of such an application is shown in FIG. 5. An RF receiver 82 utilizes a dual mode single-ended cascode LNA 84 in its front end. A receiving antenna 86 is connected to a receive/transmit RF switch 88. The receive side of the receive/transmit RF switch 88 feeds a matching network 90, which then feeds the RX input to the dual mode single-ended cascode LNA 84. The output of the dual mode single-ended cascode LNA 84 is connected to a bandpass filter (BPF) 92, which then feeds a quadrature RF mixer (MIX) 94. The quadrature RF mixer 94 and subsequent downstream receiver circuitry is comprised of a Q side and an I side.

The frequency reference inputs to the quadrature RF mixer 94 are fed from a frequency synthesizer, which is comprised of a phase locked loop (PLL) 96, feeding a voltage controlled oscillator (VCO) 98, feeding a frequency divider (% 2) 100. The quadrature RF mixer 94 down converts the received RF signal into an intermediate frequency, or into a baseband frequency, depending on the application. The outputs of the quadrature RF mixer 94 feed low pass filters (LPF) 102, which then feed the inputs of a quadrature automatic gain control amplifier (AGC) 104. The output signals from the AGC 104 feed other downstream receiver circuitry.

One function of the AGC 104 is to adjust its gain such that a constant output signal level is maintained. By measuring the amount of gain needed, the magnitude of the input signal level can be inferred. The AGC 104 feeds gain information to receive signal strength circuitry (RSS) 106, which generates receive signal strength information using the gain information and the mode status of the dual mode single-ended cascode LNA 84.

Receive signal strength information is then fed into mode select circuitry 108, which uses the information to control whether the dual mode single-ended cascode LNA 84 is operating in normal mode or low-gain mode. The mode select circuitry 108 drives the mode select input to the dual mode single-ended cascode LNA 84. When the mode select input is driven to zero volts, low-gain mode is selected. When the mode select input is driven to the appropriate bias voltage, normal mode is selected. The receive signal strength circuitry 106, the mode select circuitry 108, or both, may utilize microprocessors in their functions.

Figure 6:
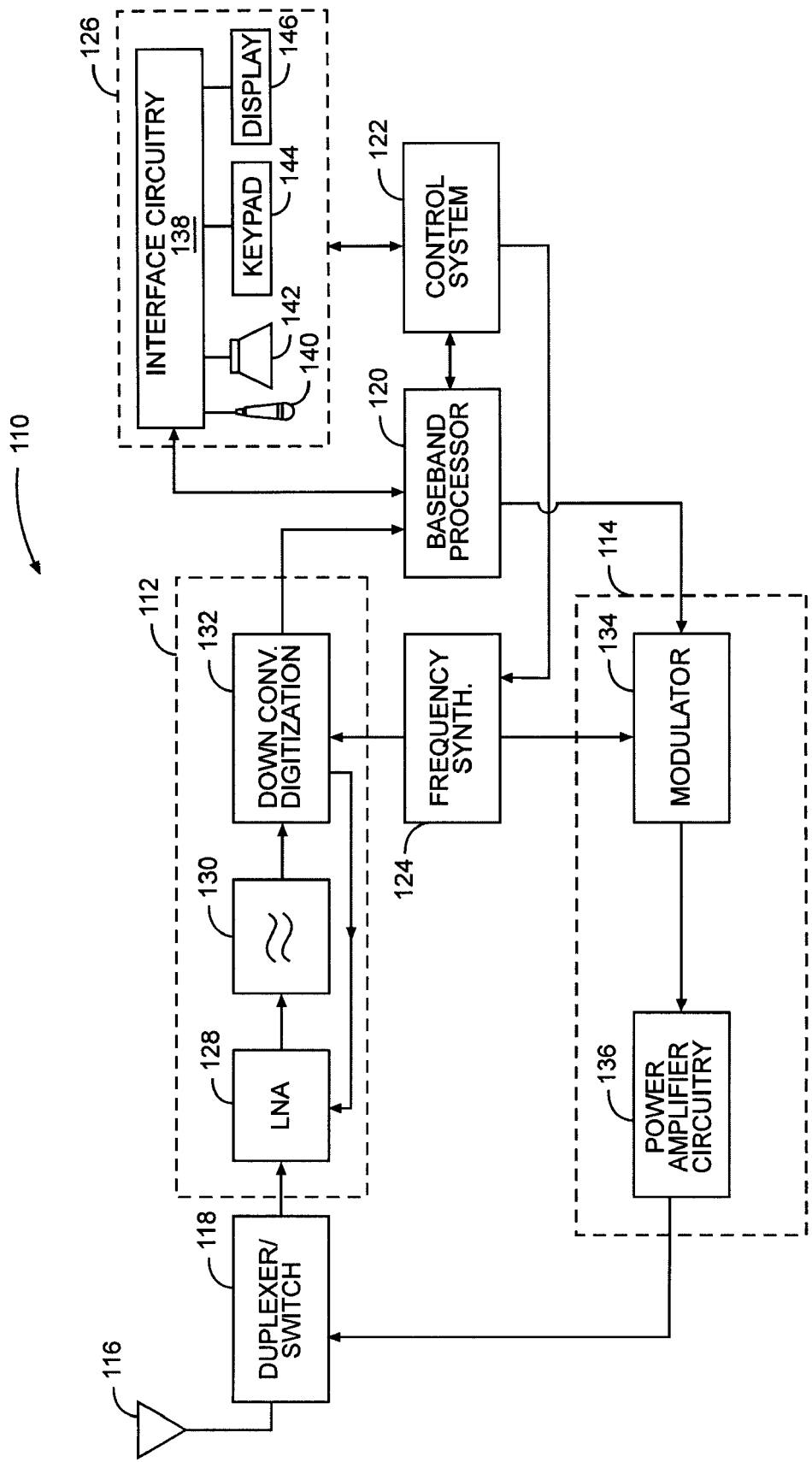
FIG. 6 shows another application of the present invention used as part of a mobile terminal.

Another application example of an LNA is its use in a mobile terminal 110. The basic architecture of the mobile terminal 110 is represented in FIG. 6 and may include a receiver front end 112, a radio frequency transmitter section 114, an antenna 116, a duplexer or switch 118, a baseband processor 120, a control system 122, a frequency synthesizer 124, and an interface 126. The receiver front end 112 receives information bearing radio frequency signals from one or more remote transmitters provided by a base station. A dual mode LNA 128 amplifies the signal. A filter circuit 130 minimizes broadband interference in the received signal, while downconversion and digitization circuitry 132 downconverts the filtered, received signal to an intermediate or baseband frequency signal, which is then digitized into one or more digital streams. The receiver front end 112 typically uses one or more mixing frequencies generated by the frequency synthesizer 124. The baseband processor 120 processes the digitized received signal to extract the information or data bits conveyed in the received signal. This processing typically comprises demodulation, decoding, and error correction operations. As such, the baseband processor 120 is generally implemented in one or more digital signal processors (DSPs). The downconversion and digitization circuitry 132 measures the strength of the received signal and selects the appropriate mode of operation for the dual mode LNA 128.

On the transmit side, the baseband processor 120 receives digitized data, which may represent voice, data, or control information, from the control system 122, which it encodes for transmission. The encoded data is output to the transmitter 114, where it is used by a modulator 134 to modulate a carrier signal that is at a desired transmit frequency. Power amplifier circuitry 136 amplifies the modulated carrier signal to a level appropriate for transmission, and delivers the amplified and modulated carrier signal to the antenna 116 through the duplexer or switch 118.

A user may interact with the mobile terminal 110 via the interface 126, which may include interface circuitry 138 associated with a microphone 140, a speaker 142, a keypad 144, and a display 146. The interface circuitry 138 typically includes analog-to-digital converters, digital-to-analog converters, amplifiers, and the like. Additionally, it may include a voice encoder/decoder, in which case it may communicate directly with the baseband processor 120. The microphone 140 will typically convert audio input, such as the user's voice, into an electrical signal, which is then digitized and passed directly or indirectly to the baseband processor 120. Audio information encoded in the received signal is recovered by the baseband processor 120, and converted by the interface circuitry 138 into an analog signal suitable for driving the speaker 142. The keypad 144 and display 146 enable the user to interact with the mobile terminal 110, input numbers to be dialed, address book information, or the like, as well as monitor call progress information.

Those skilled in the art will recognize improvements and modifications to the embodiments of the present invention. All such improvements and modifications are considered within the scope of the concepts disclosed herein and the claims that follow.

What is claimed is:

1. An amplifier circuit comprising:
 a first main cascode circuit comprising:
  a first main RF input adapted to receive a first RF input signal;
  a first main RF output; and
  a first main bias input adapted to establish an operating level for the first main cascode circuit; and
 a first normal mode cascode circuit comprising:
  a first normal mode RF input adapted to receive the first RF input signal;
  a first normal mode RF output coupled to the first main RF output; and
  a first normal mode bias input adapted to receive a mode select signal, such that:
   when the mode select signal is in a first state, the first main cascode circuit and the first normal mode cascode circuit amplify the first RF input signal to provide a combined first RF output signal at the first main RF output; and
   when the mode select signal is in a second state, the first main cascode circuit amplifies the first RF input signal to provide a first RF output signal at the first main RF output; while the first normal mode cascode circuit does not amplify the first RF input signal.

2. The amplifier circuit of claim 1 wherein when the mode select signal is in the second state, the first normal mode cascode circuit is inactive.

3. The amplifier circuit of claim 1 wherein the first normal mode cascode circuit further comprises:
 a first normal mode bias transistor comprising:
  the first normal mode bias input;
  a first normal mode cascode input; and
  the first normal mode RF output; and
 a normal mode gain transistor comprising:
  the first normal mode RF input; and
  a first normal mode cascode output coupled to the first normal mode cascode input.

4. The amplifier circuit of claim 1 wherein the first main cascode circuit further comprises:
 a first main bias transistor comprising:
  the first main bias input;
  a first main cascode input; and
  the first main RF output; and
 a first main gain transistor comprising:
  the first main RF input; and
  a first main cascode output coupled to the first main cascode input.

5. The amplifier circuit of claim 1 further comprising a first inductive element and a second inductive element wherein:
 the first main cascode circuit further comprises a first main common node;
 the first normal mode cascode circuit further comprises a first normal mode common node;
 the first inductive element is coupled between the first main common node and the first normal mode common node; and
 the second inductive element is coupled between the first normal mode common node and ground.

6. The amplifier circuit of claim 5 wherein the inductances for the first inductive element and the second inductive element are such that an input impedance for the first RF input signal is substantially dynamic-matched whether the mode select signal is in the first state or the second state.

7. The amplifier circuit of claim 1 wherein a bandwidth of the amplifier circuit is substantially dynamic-matched whether the mode select signal is in the first state or the second state.

8. The amplifier circuit of claim 1 wherein a gain of the amplifier circuit is controlled by the mode select signal such that when the mode select signal is in the first state, the gain is higher than when the mode select signal is in the second state.

9. The amplifier circuit of claim 1 further comprising:
 a second main cascode circuit comprising:
  a second main RF input adapted to receive a second RF input signal;
  a second main RF output; and
  a second main bias input adapted to establish an operating level for the second main cascode circuit; and
 a second normal mode cascode circuit comprising:
  a second normal mode RF input adapted to receive the second RF input signal;
  a second normal mode RF output coupled to the second main RF output; and
  a second normal mode bias input adapted to receive the mode select signal; such that
   when the mode select signal is in the first state, the second main cascode circuit and the second normal mode cascode circuit amplify the second RF input signal to provide a combined second RF output signal at the second main RF output; and
   when the mode select signal is in the second state, the second main cascode circuit amplifies the second RF input signal to provide a second RF output signal at the second main RF output while the second normal mode cascode circuit does not amplify the second RF input signal,
 wherein the first main mode cascode circuit, the first normal mode cascode circuit, the second main mode cascode circuit, and the second normal mode cascode circuit combine to form a differential amplifier, such that the first RF input signal and the second RF input signal provide the differential input and the first RF output signal and the second RF output signal provides the differential output.

10. The amplifier circuit of claim 9 wherein:
 the first normal mode cascode circuit further comprises:
  a first normal mode bias transistor comprising:
   the first normal mode bias input;
   a first normal mode cascode input; and
   the first normal mode RF output; and
  a first normal mode gain transistor comprising:
   the first normal mode RF input; and
   a first normal mode cascode output coupled to the first normal mode cascode input; and
 the second normal mode cascode circuit further comprises:
  a second normal mode bias transistor comprising:

the second normal mode bias input;
a second normal mode cascode input; and
the second normal mode RF output; and
a second normal mode gain transistor comprising:
the second normal mode RF input; and
a second normal mode cascode output coupled to the second normal mode cascode input.

11. The amplifier circuit of claim 9 wherein:
the first main cascode circuit further comprises:
a first main bias transistor comprising:
the first main bias input;
a first main cascode input; and
the first main RF output; and
a first main gain transistor comprising:
the first main RF input; and
a first main cascode output coupled to the first main cascode input; and
the second main cascode circuit further comprises:
a second main bias transistor comprising:
the second main bias input;
a second main cascode input; and
the second main RF output; and
a second main gain transistor comprising:
the second main RF input; and
a second main cascode output coupled to the second main cascode input.

12. The amplifier circuit of claim 9 further comprising a first inductive element, a second inductive element, a third inductive element, and a fourth inductive element wherein:
the first main cascode circuit further comprises a first main common node;
the first normal mode cascode circuit further comprises a first normal mode common node;
the second main cascode circuit further comprises a second main common node;
the second normal mode cascode circuit further comprises a second normal mode common node;
the first inductive element is coupled between the first main common node and the first normal mode common node;
the second inductive element is coupled between the first normal mode common node and ground;
the third inductive element is coupled between the second main common node and the second normal mode common node; and
the fourth inductive element is coupled between the second normal mode common node and ground.

13. The amplifier circuit of claim 12 wherein:
inductances for the first inductive element and the second inductive element are such that an input impedance for the first RF input signal is substantially unchanged whether the mode select signal is in the first state or the second state, and
inductances for the third inductive element and the fourth inductive element are such that an input impedance for the second RF input signal is substantially unchanged whether the mode select signal is in the first state or the second state.

14. The amplifier circuit of claim 9 wherein a bandwidth of the amplifier circuit is substantially unchanged whether the mode select signal is in the first state or the second state.

15. The amplifier circuit of claim 9 wherein a gain of the amplifier circuit is controlled by the mode select signal such that when the mode select signal is in the first state, the gain is higher than when the mode select signal is in the second state.

* * * * *